United States Patent
Chen et al.

(10) Patent No.: US 7,584,067 B2
(45) Date of Patent: Sep. 1, 2009

(54) APPARATUS FOR MEASURING AVERAGE POWER CONSUMPTION OF COMPUTER SYSTEM

(75) Inventors: Xiao-Zhu Chen, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 140 days.

(21) Appl. No.: 11/749,168

(22) Filed: May 16, 2007

(65) Prior Publication Data

US 2008/0071485 A1    Mar. 20, 2008

(30) Foreign Application Priority Data

Sep. 20, 2006    (CN) .................... 2006 1 0200886

(51) Int. Cl.
*G06F 19/00* (2006.01)
(52) U.S. Cl. ........................ 702/61; 324/141
(58) Field of Classification Search .............. 702/61, 702/62–64, 66, 76, 79, 182–185; 324/141, 324/142
See application file for complete search history.

(56) References Cited

U.S. PATENT DOCUMENTS 6,321,341 B1   11/2001   Kamijo et al.
2008/0176608 A1*  7/2008   Budampati et al. .......... 455/572

\* cited by examiner

*Primary Examiner*—Edward Raymond
(74) *Attorney, Agent, or Firm*—Frank R. Niranjan

(57) ABSTRACT

An apparatus for measuring average power consumption of a computer system includes a current to voltage converter for receiving an operating current of the computer system and transforming the operating current into a voltage signal; an analog-digital converter connected to the current to voltage converter for receiving the voltage signal, and converting the voltage signal into a digital signal indicating a value of the operating current; a micro controller unit connected to the analog-digital converter for receiving the digital signal, and calculating a value of the average power consumption of the computer system during a determined period of time, the value of the average power consumption being converted into a display-driving signal; and a display module connected to the micro controller unit for receiving the display-driving signal, and displaying the value of the average power consumption.

8 Claims, 1 Drawing Sheet

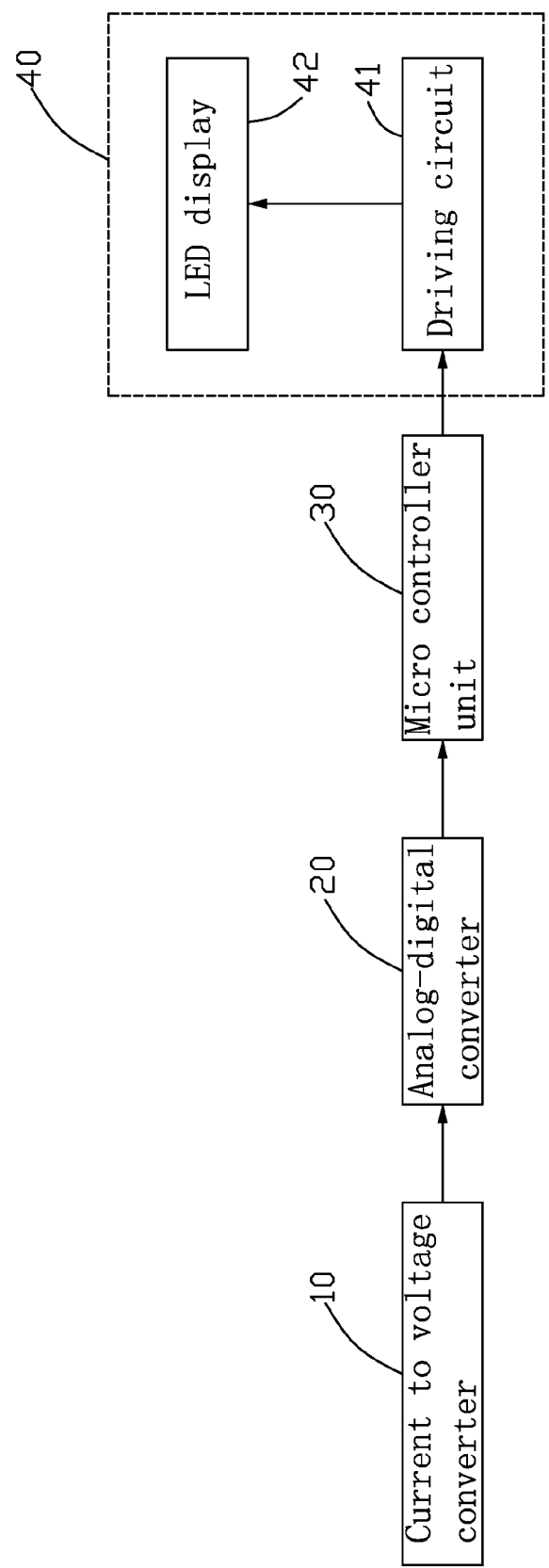

APPARATUS FOR MEASURING AVERAGE POWER CONSUMPTION OF COMPUTER SYSTEM

BACKGROUND OF THE INVENTION

1. Field of the Invention

The present invention relates to computer systems. In particular, the present invention relates to an apparatus for measuring average power consumption of a computer system.

2. Description of Related Art

Power consumption is a quantitative indication of the ratio of how much energy is consumed or how much work is done per unit of time, and indicates the amount of energy supplied or consumed in a unit second. Usually a system designer designs circuits of a computer system according to the maximum power consumption of the computer system. However, the computer system does not always work under full load, so the circuit design according to the maximum power consumption of the computer system is unreasonable, and moreover it increases cost. A reasonable method is to design the circuits of the computer system according to an average power consumption of the computer system during a continuous working period.

What is needed is an apparatus for measuring average power consumption of a computer system.

SUMMARY OF THE INVENTION

An exemplary apparatus for measuring average power consumption of a computer system includes a current to voltage converter for receiving an operating current of the computer system and transforming the operating current into a voltage signal; an analog-digital converter connected to the current to voltage converter for receiving the voltage signal, and converting the voltage signal into a digital signal indicating a value of the operating current; a micro controller unit connected to the analog-digital converter for receiving the digital signal, and calculating a value of the average power consumption of the computer system during a determined period of time, the value of the average power consumption being converted into a display-driving signal; and a display module connected to the micro controller unit for receiving the display-driving signal, and displaying the value of the average power consumption.

Other advantages and novel features of the present invention will become more apparent from the following detailed description of preferred embodiment when taken in conjunction with the accompanying drawings, in which:

BRIEF DESCRIPTION OF THE DRAWINGS

The drawing is a block diagram of an apparatus for measuring average power consumption of a computer system according to a preferred embodiment of the present invention.

DETAILED DESCRIPTION OF THE INVENTION

Referring to the drawing, an apparatus for measuring average power consumption of a computer system according to a preferred embodiment of the present invention includes a current to voltage converter 10, an analog-digital converter (ADC) 20, a micro controller unit (MCU) 30, and a display module 40.

The current to voltage converter 10 is an electric current sensor, which is used for receiving an operating current of the computer system, i.e., the current output from a power supply of the computer system. The current to voltage converter 10 transforms the operating current into a voltage signal. The value of the voltage signal varies linearly with the value of the operating current. In this embodiment, the value of the voltage signal is equal to the value of the operating current.

The voltage signal is transmitted to the ADC 20 for analog-digital converting, and produces a digital signal indicating the value of the voltage signal. The digital signal also indicates the value of the operating current of the computer system because the value of the voltage signal varies linearly with the value of the operating current.

The MCU 30 is programmable, compatible with MCS-51 instruction system, and having a built-in 8-Bit central processing unit (CPU) and a built-in flash memory. The digital signal from the ADC 20 is transmitted to the MCU 30.

The operating voltage of the computer system is constant, so the MCU 30 is programmed to multiply the operating voltage of the computer system by the digital signal from the ADC 20 to get an instantaneous power consumption of the computer system. The MCU 30 averages a plurality of power consumption readings taken over a determined period of time to calculate average power consumption of the computer system. The value of the average power consumption is converted into a display-driving signal and the display-driving signal is transmitted to the display module 40 for displaying the average power consumption.

The display module 40 includes a driving circuit 41, and a lighting emitting diode (LED) display 42 electrically connected to the driving circuit 41. The driving circuit 41 receives the display-driving signal from the MCU 30 and generates a display signal. The display signal is transmitted to the LED display 42 to display the average power consumption.

The apparatus can measure and display the average power consumption of the computer system, which is convenient for system designers to consider during their circuit design, and decrease the designing cost.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus for measuring average power consumption of a computer system, comprising: a current to voltage converter configured for receiving an operating current of the computer system and transforming the operating current into a voltage signal; an analog-digital converter connected to the current to voltage converter for receiving the voltage signal, and converting the voltage signal into a digital signal indicating a value of the operating current; a micro controller unit connected to the analog-digital converter capable of receiving the digital signal, and calculating a value of the average power consumption of the computer system according to the digital signals received during a determined period of time, the value of the average power consumption being converted into a display-driving signal; and a display module connected to the micro controller unit capable of receiving the display-driving signal, and displaying the value of the average power consumption, wherein the value of the voltage signal equals the value of the operating current, and wherein the micro controller unit is programmed to multiply an operating voltage of the computer system by the digital signal from the analog-digital converter to get an instantaneous power consumption of the computer system, the micro controller unit averages a plurality of power consumption readings of the computer system in a determined period of time to calculate the value of the average power consumption of the computer system.

2. The apparatus as described in claim 1, wherein the current to voltage converter is an electric current sensor.

3. The apparatus as described in claim 1, wherein the display module includes a driving circuit, and an LED display electrically connected to the driving circuit, the driving circuit receives the display-driving signal and generates a display signal transmitted to the LED display, the LED display displays the display signal corresponding to the value of the average power consumption.

4. An apparatus for measuring average power consumption of a computer system, comprising:
   an electric current sensor capable of transforming an operating current of the computer system into a voltage signal;
   an analog-digital converter connected to the electric current sensor capable of converting the voltage signal into a digital signal indicating a value of the operating current;
   a micro controller unit connected to the analog-digital converter capable of receiving the digital signal, and multiplying an operating voltage of the computer system by the digital signal from the analog-digital converter to get an instantaneous power consumption of the computer system, then averaging a plurality of the instantaneous power consumption readings taken over a determined period of time to calculate a value of the average power consumption of the computer system during the determined period of time, and converting the value of the average power consumption into a display-driving signal; and
   a display module connected to the micro controller unit capable of receiving the display-driving signal and displaying the value of the average power consumption.

5. The apparatus as described in claim 4, wherein the display module includes a driving circuit, and an LED display electrically connected to the driving circuit, the driving circuit receives the display-driving signal and generates a display signal transmitted to the LED display which displays the display signal indicating the value of the average power consumption.

6. The apparatus as described in claim 4, wherein the value of the voltage signal equals the value of the operating current.

7. A method for measuring average power consumption of a computer system, comprising:
   detecting an operating current of the computer system and converting the operating current into a voltage signal;
   converting the voltage signal into a digital signal indicating the value of the operating current;
   multiplying an operating voltage of the computer system by the digital signal to get an instantaneous power consumption of the computer system;
   avenging a plurality of the instantaneous power consumption readings taken over a determined period of time to calculate a value of the average power consumption of the computer system during the determined period of time, and
   displaying the value of the average power consumption.

8. The method as claimed in claim 7, further comprising converting the value of the average power consumption into a display-driving signal and converting the display-driving signal into a display signal indicating the value of the average power consumption, wherein the display signal is displayed by a display.

* * * * *